(12) United States Patent
Saegusa (10) Patent No.: US 11,101,777 B2
(45) Date of Patent: Aug. 24, 2021

(54) SEMICONDUCTOR INTEGRATED CIRCUIT (71) Applicant: ROHM CO., LTD., Kyoto (JP)

(72) Inventor: Yuji Saegusa, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 129 days.

(21) Appl. No.: 16/423,877

(22) Filed: May 28, 2019

(65) Prior Publication Data

US 2019/0363681 A1 Nov. 28, 2019

(30) Foreign Application Priority Data

May 28, 2018 (JP) .............................. JP2018-101242

(51) Int. Cl.
*H03F 1/52* (2006.01)
*H03F 3/45* (2006.01)
*H04R 3/00* (2006.01)

(52) U.S. Cl.
CPC ......... *H03F 1/523* (2013.01); *H03F 3/45269* (2013.01); *H04R 3/007* (2013.01); *H03F 2200/03* (2013.01); *H03F 2200/129* (2013.01); *H03F 2200/426* (2013.01); *H03F 2203/45116* (2013.01); *H03F 2203/45528* (2013.01)

(58) Field of Classification Search
CPC ..................................................... H03F 1/523
See application file for complete search history.

(56) References Cited

U.S. PATENT DOCUMENTS 5,737,169 A * 4/1998 Sellers ............... H03K 17/0822
361/18
7,205,834 B2 * 4/2007 Goto ..................... H03F 3/2173
330/10
(Continued)

FOREIGN PATENT DOCUMENTS

CN 1910529 A 2/2007
CN 101188381 A 5/2008
(Continued)

OTHER PUBLICATIONS

CN Search Report for corresponding CN 201910428057.4 dated Mar. 27, 2020.
(Continued)

*Primary Examiner* — Patricia T Nguyen
(74) *Attorney, Agent, or Firm* — Cantor Colburn LLP (57) ABSTRACT

An output OUT is coupled to a load. A high-side transistor MH is arranged such that its source is coupled to a power supply line, and such that its drain is coupled to an output terminal OUT. A first OCP circuit compares a first current detection signal $I_{CS1}$ that corresponds to a current $I_{SRC}$ that flows through the high-side transistor MH with a first threshold value $I_{OCP}$ having a positive correlation with a power supply voltage $V_{DD}$ of a power supply line, and generates a first OCP signal $S_{OCP}$ that indicates the comparison result. A driving circuit latch-stops the driving operation of the high-side transistor MH according to the first OCP signal $S_{OCP}$.

15 Claims, 11 Drawing Sheets

(56) References Cited

U.S. PATENT DOCUMENTS

| | | | |
|---|---|---|---|
| 9,906,143 B1* | 2/2018 | Yu | H02H 7/1213 |
| 10,811,968 B2* | 10/2020 | Mahmoudi | H02M 3/158 |
| 2008/0116872 A1* | 5/2008 | Nakazono | H02M 1/32 |
| | | | 323/284 |
| 2010/0277142 A1 | 11/2010 | Tan et al. | |
| 2016/0373073 A1* | 12/2016 | Kato | H04R 3/00 |
| 2017/0201086 A1* | 7/2017 | Chen | H02H 3/08 |
| 2019/0296704 A1* | 9/2019 | Iwamoto | G05F 3/26 |

FOREIGN PATENT DOCUMENTS

| | | |
|---|---|---|
| CN | 104467704 A | 3/2015 |
| CN | 107085448 A | 8/2017 |
| CN | 107834985 A | 3/2018 |
| TW | 201348916 A | 12/2013 |

OTHER PUBLICATIONS

CNIPA First Office Action for corresponding CN201910428057.4; dated Apr. 17, 2020.
CNIPA Second Office Action for corresponding CN Application No. 201910428057.4.; dated Nov. 25, 2020.
CNIPA Rejection Decision for corresponding CN Application No. 201910428057.4; dated May 18, 201.

\* cited by examiner

SEMICONDUCTOR INTEGRATED CIRCUIT

CROSS REFERENCE TO RELATED APPLICATION

The present application claims priority under 35 U.S.C. § 119 to Japanese Patent Application No. 2018-101242, filed on May 28, 2018, is incorporated herein by reference in its entirety.

BACKGROUND OF THE INVENTION

1. Field of the Invention

The present invention relates to an overcurrent protection technique.

2. Description of the Related Art

Figure 1:
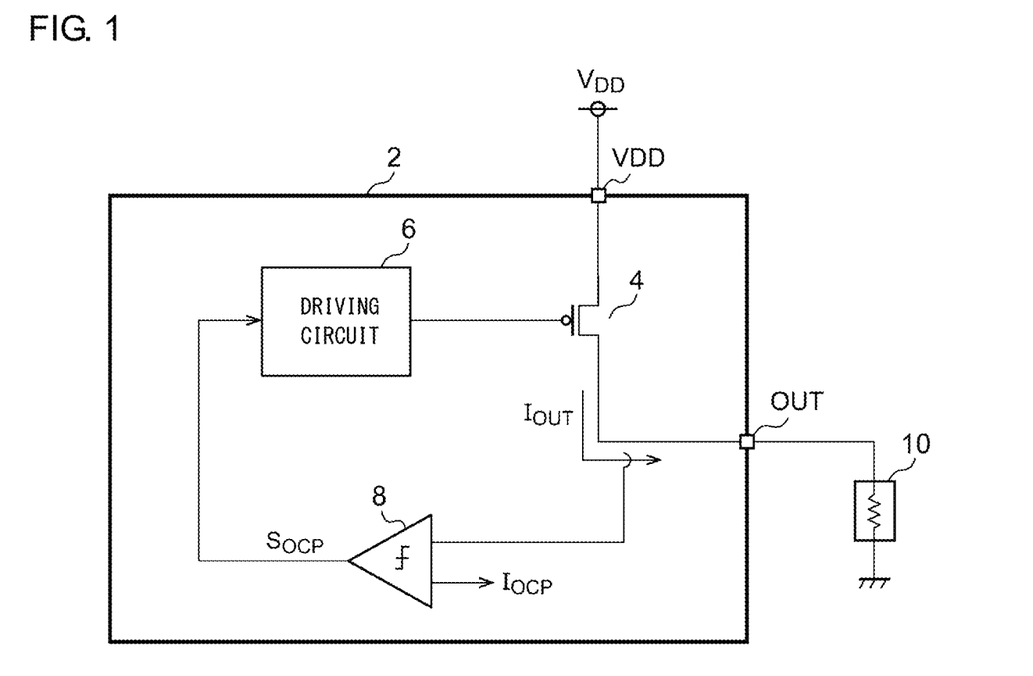
FIG. 1 is a block diagram showing a semiconductor integrated circuit including a power transistor.

A semiconductor integrated circuit is provided with an overcurrent protection circuit to protect its circuit elements. FIG. 1 is a block diagram showing a semiconductor integrated circuit 2 including a power transistor. The semiconductor integrated circuit 2 includes a power transistor 4 configured as a PMOS transistor, a driving circuit 6, and an overcurrent protection circuit 8. The power transistor 4 is arranged between a power supply terminal VDD and an output terminal OUT. A load 10 is coupled to the output terminal OUT.

If a short-circuit occurs in the output terminal OUT (short-circuit to the ground) in a state in which the power transistor 4 is turned on, a large current flows through the power transistor 4. The overcurrent protection (OCP) circuit 8 monitors the current that flows through the power transistor 4. When the current thus monitored exceeds a predetermined threshold current $I_{OCP}$, the overcurrent protection circuit 8 asserts a protection signal $S_{OCP}$. The driving circuit 6 latches the assertion of the protection signal $S_{OCP}$, and turns off the power transistor 4 (latch stop).

Figure 2:
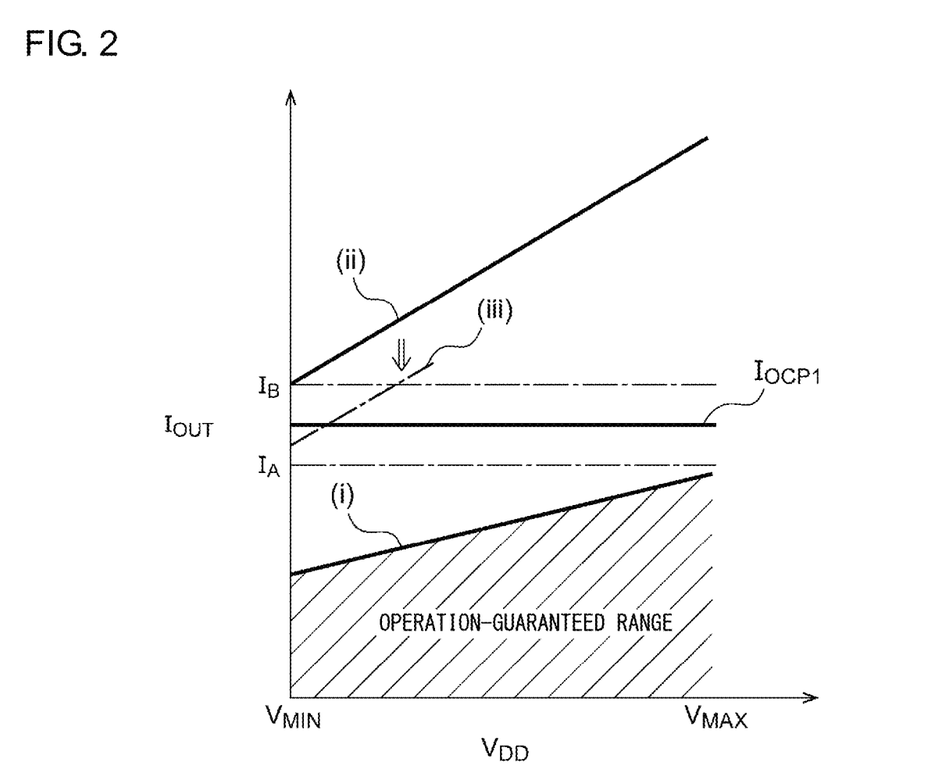
FIG. 2 is a diagram showing the relation between the power supply voltage $V_{DD}$ and the output current $I_{OUT}$.

FIG. 2 is a diagram showing the relation between a power supply voltage $V_{DD}$ and an output current $I_{OUT}$. The voltages indicated by $V_{MIN}$ and $V_{MAX}$ on the horizontal axis indicate the minimum voltage and the maximum voltage of the operation-guaranteed range. In the drawing, the three lines (i), (ii), and (iii) are shown. For simplicity, let us consider a state in which the power transistor 4 is fully on. In this state, the relation $V_{OUT} \approx V_{DD}$ holds true. Here, the line (i) represents the upper limit line of the operation-guaranteed range, which is determined according to the load line determined due to the load 10.

$$I_{OUT} = V_{OUT}/R_L \approx V_{DD}/R_L$$

Here, RL represents the load impedance. The on resistance $R_{ON}$ of the power transistor is sufficiently smaller than the load impedance $R_L$. Accordingly, the on resistance $R_{ON}$ is negligible.

The upper-side line (ii) represents a range to be judged as an overcurrent state. Specifically, the upper-side line (ii) represents the voltage-current characteristics when the output terminal OUT is short-circuited to the ground. The impedance of a ground path when the output terminal is short-circuited to the ground is small, on the order of several dozen mΩ. Accordingly, the voltage $V_{OUT}$ of the output terminal becomes a value in the vicinity of 0 V. In this case, the drain-source voltage of the power transistor 4 is substantially equal to the power supply voltage $V_{DD}$. In a range in which the relation $V_{DD} > V_{GS} - V_{TH}$ holds true, the MOSFET operates in its saturation range. In this state, the drain current (i.e., output current $I_{OUT}$) is represented by $I_{OUT} = \beta [\frac{1}{2} \bullet (V_{GS} - V_{TH})^2]$. Here, $\beta$ represents a constant value. For simplicity, in a case assuming that the gate voltage $V_G$ is maintained at a constant value, the relation $V_{GS} = V_{DD} - V_G$ holds true. Accordingly, the drain current can be approximated by the following expression. The upper-side line (ii) is defined based on the approximation expression thus derived. It should be noted that, in FIG. 2, the line (ii) is shown in a simplified manner as a straight line.

$$I_{OUT} = \beta [\frac{1}{2} \bullet (V_{DD} - V_{TH})^2].$$

In the operation-guaranteed range, which is lower than the line (i), the overcurrent protection must not be provided. Conversely, in a protection range, which is above the line (ii), the overcurrent protection must be provided. Accordingly, the threshold value $I_{OCP}$ to be set for the overcurrent protection is required to be determined between the maximum current $I_A$ of the operation-guaranteed range and the minimum current $I_B$ of the protection range.

However, as can be understood from FIG. 2, in a case in which the minimum operation voltage $V_{MIN}$ is further lowered, this narrows the difference between the currents $I_A$ and $I_B$, leading to difficulty in setting the threshold value $I_{OCP}$. Also, in a case in which the impedance value $R_L$ of the load 10 is lowered, this shifts the line (i) which indicates the upper limit value of the operation-guaranteed range toward the upper side, leading to difficulty in setting the threshold value $I_{OCP}$.

The line (iii) represents a situation in which the characteristic line (ii) shifts in a direction in which the current represented by the characteristic line (ii) is reduced due to variation of the MOSFET or the like. In such a situation, the output current $I_{OUT}$ is lower than the overcurrent threshold value $I_{OCP}$ regardless of whether or not the output is short-circuited to the ground. Such an arrangement has the potential to cause a problem in that the overcurrent protection cannot be supported.

It should be noted that the above-described problem is by no means within the scope of common and general knowledge in the field of the present invention. Furthermore, it can be said that the present inventor has been the first to arrive at such a problem.

SUMMARY OF THE INVENTION

The present invention has been made in order to solve such a problem. Accordingly, it is an exemplary purpose of an embodiment of the present invention to provide a semiconductor integrated circuit having an effective overcurrent protection function even if a voltage reduction state has occurred.

An embodiment of the present invention relates to a semiconductor integrated circuit. The semiconductor integrated circuit comprises: an output terminal to be coupled to a load; a high-side transistor structured as a PMOS transistor having a source coupled to a power supply line and a drain coupled to the output terminal; a first overcurrent protection circuit structured to compare a first current detection signal that corresponds to a current that flows through the high-side transistor with a first threshold value having a positive correlation with a power supply voltage of the power supply line, and to generate a first overcurrent protection signal that indicates a comparison result; and a driving circuit structured to turn off the high-side transistor according the first overcurrent protection signal.

It should be noted that any desired combinations of the aforementioned components or the representation of the present invention may be mutually substituted between a method, apparatus, and so forth, which are also effective as an embodiment of the present invention.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

In the present specification, the state represented by the phrase "the member A is coupled to the member B" includes a state in which the member A is indirectly coupled to the member B via another member that does not affect the electric connection state between them, or that does not damage the functions of the connection between them, in addition to a state in which they are physically and directly coupled.

Similarly, the state represented by the phrase "the member C is provided between the member A and the member B" includes a state in which the member A is indirectly coupled to the member C, or the member B is indirectly coupled to the member C via another member that does not affect the electric connection state between them, or that does not damage the functions of the connection between them, in addition to a state in which they are directly coupled.

Figure 3:
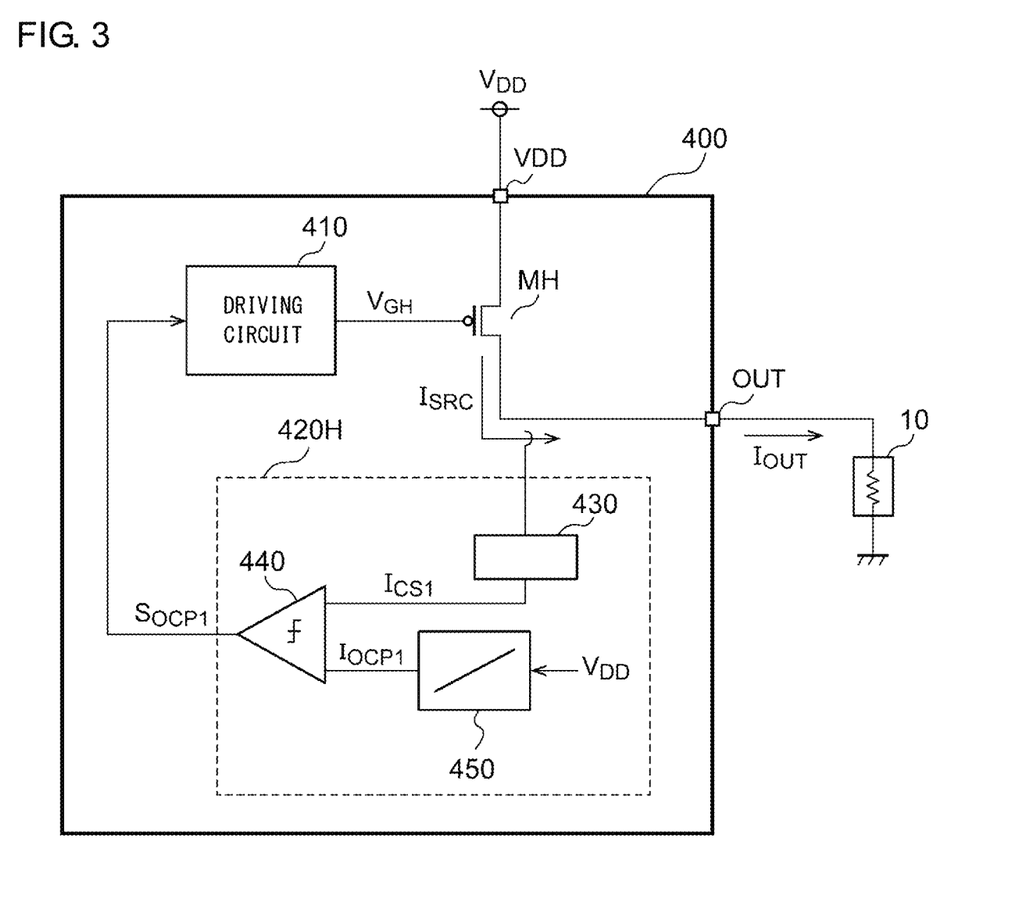
FIG. 3 is a function block diagram showing a semiconductor integrated circuit according to an embodiment.

FIG. 3 is a function block diagram showing a semiconductor integrated circuit 400 according to an embodiment. The semiconductor integrated circuit 400 includes a high-side transistor MH, a driving circuit 410, and an overcurrent protection (OCP) circuit 420H. The semiconductor integrated circuit 400 further includes a power supply terminal VDD that receives the power supply voltage $V_{DD}$ and an output (OUT) terminal to be coupled to a load 10.

The high-side transistor MH is configured as a PMOS transistor. The high-side transistor MH has its source coupled to a power supply line (power supply terminal) VDD and its drain coupled to the OUT terminal. The driving circuit 410 adjusts a gate voltage $V_{GH}$ of the high-side transistor MH so as to control an electrical state of the load 10. In the present embodiment, the current that flows through the high-side transistor MH (which will be referred to as a "source current $I_{SRC}$") is supplied to the load 10 as an output current $I_{OUT}$.

The first OCP circuit 420H compares a first current detection signal $I_{CS1}$ that corresponds to a source current $I_{SRC}$ that flows through the high-side transistor MH with a first threshold value $I_{OCP1}$ having a positive correlation with the power supply voltage $V_{DD}$ of the power supply line, and generates a first OCP signal $S_{OCP1}$ that indicates a comparison result. For example, when an overcurrent state ($I_{CS1} > I_{OCP1}$) has been detected, the first OCP signal $S_{OCP1}$ is asserted (set to the high level). Conversely, when a normal state ($I_{CS1} < I_{OCP1}$) has been detected, the first OCP signal $S_{OCP1}$ is negated (set to the low level).

The first OCP circuit 420H may include, as its functional components, a current detection circuit 430, a comparison circuit 440, and a threshold value adjustment circuit 450. The current detection circuit 430 generates a current detection signal $I_{CS1}$ that corresponds to the source current $I_{SRC}$. The comparison circuit 440 compares the current detection signal $I_{CS1}$ with the first threshold value $I_{OCP1}$, and generates the first OCP signal $S_{OCP1}$. The threshold value adjustment circuit 450 changes the first threshold value $I_{OCP1}$ such that the first threshold value $I_{OCP1}$ has power supply voltage dependence, and more specifically, such that the first threshold value $I_{OCP1}$ has a positive correlation with the power supply voltage $V_{DD}$. Preferably, the threshold value $I_{OCP1}$ is linearly changed with respect to the power supply voltage $V_{DD}$. The current detection signal $I_{CS1}$ and the threshold value $I_{OCP1}$ may each be generated as a current signal, or otherwise may each be generated as a voltage signal. Also, the output signal of the threshold value adjustment circuit 450 may be configured as the threshold value $I_{OCP1}$ itself having power supply voltage dependence without change. Also, the output signal of the threshold value adjustment circuit 450 may be configured as a signal (e.g., reference signal $I_{REF0}$ shown in FIG. 7 and FIG. 8) to be used to change the threshold value $I_{OCP1}$ generated by an internal component of the comparison circuit 440 according to the power supply voltage.

The driving circuit 410 turns off the high-side transistor MH in response to an assertion of the first OCP signal $S_{OCP1}$. More specifically, when the first OCP signal $S_{OCP1}$ is asserted, a flip-flop (latch) holds the assertion state, and the gate voltage $V_{GH}$ of the high-side transistor MH is set to the high level (gate-source voltage is set to zero), which shuts off the high-side transistor MH.

Figure 4:
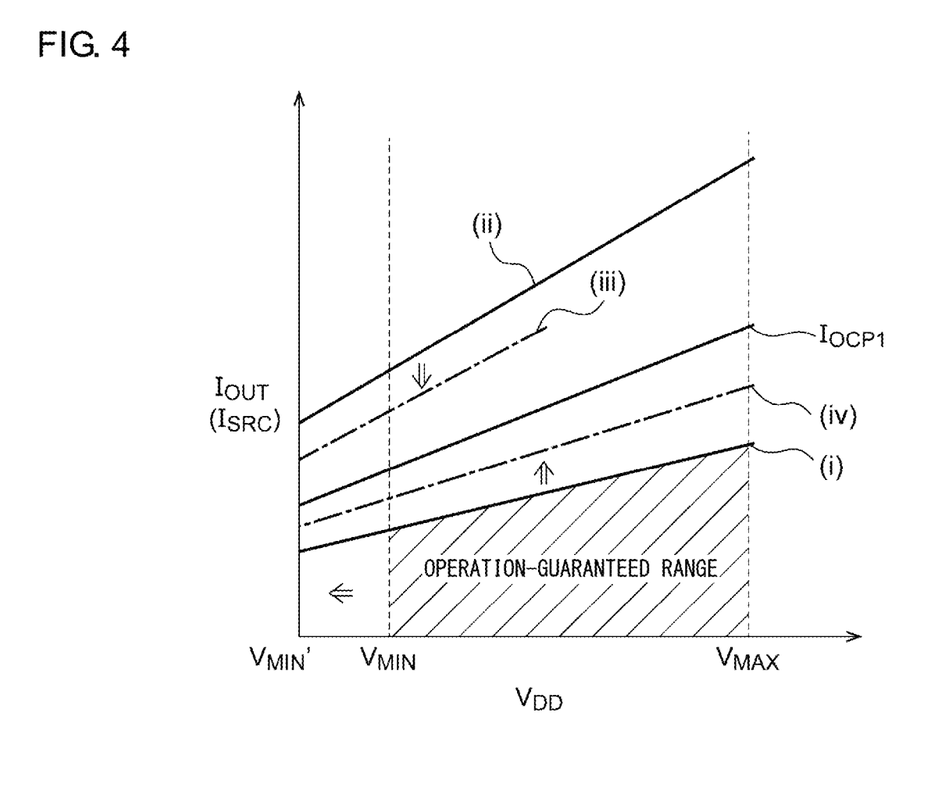
FIG. 4 is a diagram for explaining the operation of the semiconductor integrated circuit shown in FIG. 3.

The above is the configuration of the semiconductor integrated circuit 400. Next, description will be made regarding the operation thereof. FIG. 4 is a diagram for explaining the operation of the semiconductor integrated circuit 400 shown in FIG. 3. The horizontal axis represents the power supply voltage $V_{DD}$, and the vertical axis represents the output current $I_{OUT}$ (source current $I_{SRC}$). In FIG. 4, the three lines (i) through (iii) are shown. That is to say, the line (i) represents the upper limit of the operation-guaranteed range, the line (ii) represents the characteristics (typical value) of the semiconductor integrated circuit 400 when it is short-circuited to the ground, and the line (iii) represents the characteristics thereof when it is short-circuited to the ground assuming that there is variation of the MOSFET.

The slope ($dI_{OCP1}/dV_{DD}$) of the first threshold value $I_{OCP1}$ with respect to the power supply voltage $V_{DD}$ is preferably designed to be equal to or greater than that of the upper limit (load line (i)) of the operation-guaranteed range. Furthermore, the slope ($dI_{OCP1}/dV_{DD}$) of the first threshold value $I_{OCP1}$ with respect to the power supply voltage $V_{DD}$ is preferably designed to be equal to or smaller than that of the load line (ii), which represents the short-circuit state.

In the present embodiment, the threshold value $I_{OCP1}$ for the overcurrent protection is designed to have a positive correlation with respect to the power supply voltage $V_{DD}$, i.e., to have characteristics exhibiting a positive slope. In the power supply voltage range of $V_{MIN}$ up to $V_{MAX}$ in which the operation-guaranteed state is to be supported, in particular, in a voltage reduction state, this arrangement ensures that the characteristic lines (ii) and (iii) are both maintained above the threshold value $I_{OCP1}$ without crossing the threshold value $I_{OCP1}$ line. Accordingly, if a short circuit to ground has occurred, the relation $I_{SRC} > I_{OCP1}$ holds true, thereby allowing the overcurrent protection to be applied.

Furthermore, over the entire power supply voltage range from $V_{MIN}$ up to $V_{MAX}$, the overcurrent threshold value $I_{OCP1}$ is positioned above the operation-guaranteed range. Accordingly, such an arrangement does not involve electric power supplied to the load 10 being limited due to the overcurrent protection.

Furthermore, with the semiconductor integrated circuit 400 according to the embodiment, such an arrangement allows the operation-guaranteed range to be extended, which is an advantage. That is to say, even in a case in which the minimum voltage $V_{MIN}$ is further lowered to a minimum voltage $V_{MIN}'$, the threshold value $I_{OCP1}$ line crosses neither the load line (i) nor the load line (iii). In other words, the threshold value $I_{OCP1}$ line extends in a range between the load lines (i) and (iii).

In a case in which electric power supplied to the load 10 is raised (i.e., in a case in which the load impedance is lowered), the load line (i) shifts upward as indicated by the line of alternately long and short dashes (iv). However, the threshold value $I_{OCP1}$ line does not cross any of the load lines (i) through (iv). That is to say, the threshold value $I_{OCP1}$ line extends in a range defined between the load lines (i) through (iv).

As described above, with the semiconductor integrated circuit 400, the operation-guaranteed range can be extended toward the lower voltage side with respect to the horizontal axis, and can be extended toward the heavier load side with respect to the vertical axis.

Figure 5A:
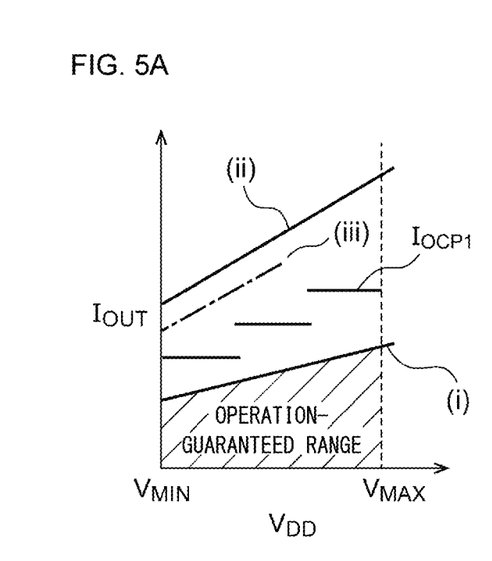
FIG. 5A through FIG. 5C are diagrams for explaining a semiconductor integrated circuit according to a modification.
Figure 5B:
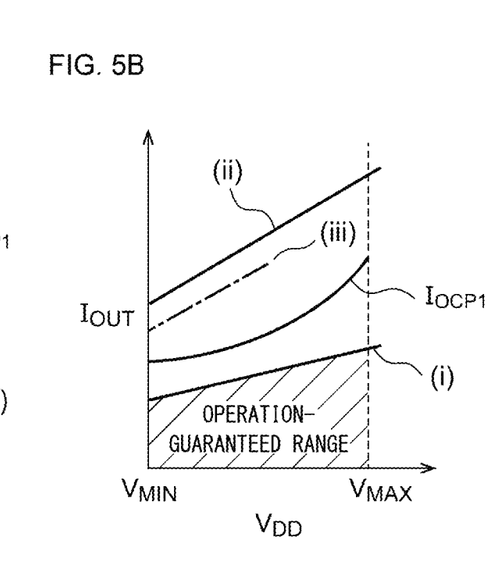
Figure 5C:
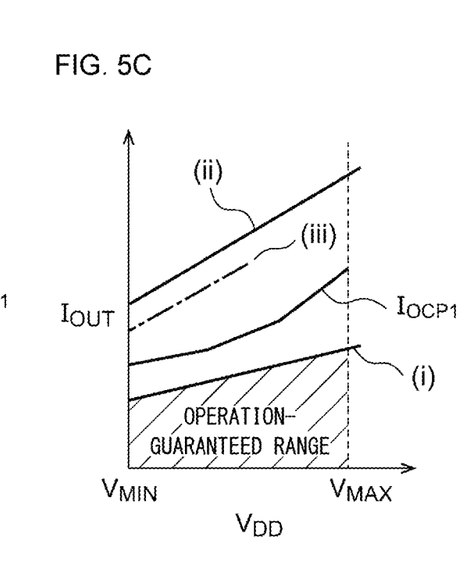

Description has been made with reference to FIG. 4 regarding an arrangement in which the threshold value $I_{OCP1}$ is linearly changed according to the power supply voltage. However, the present invention is not restricted to such an arrangement. FIG. 5A through FIG. 5C are diagrams each explaining an operation of the semiconductor integrated circuit 400 according to a modification. As shown in FIG. 5A, the threshold value $I_{OCP1}$ may be changed in a stepwise manner according to the power supply voltage $V_{DD}$. Also, as shown in FIG. 5B, the threshold value $I_{OCP1}$ may be changed nonlinearly according to the power supply voltage $V_{DD}$. Also, as shown in FIG. 5C, the threshold value $I_{OCP1}$ line may be designed as a combination of straight lines having different slopes.

Figure 6:
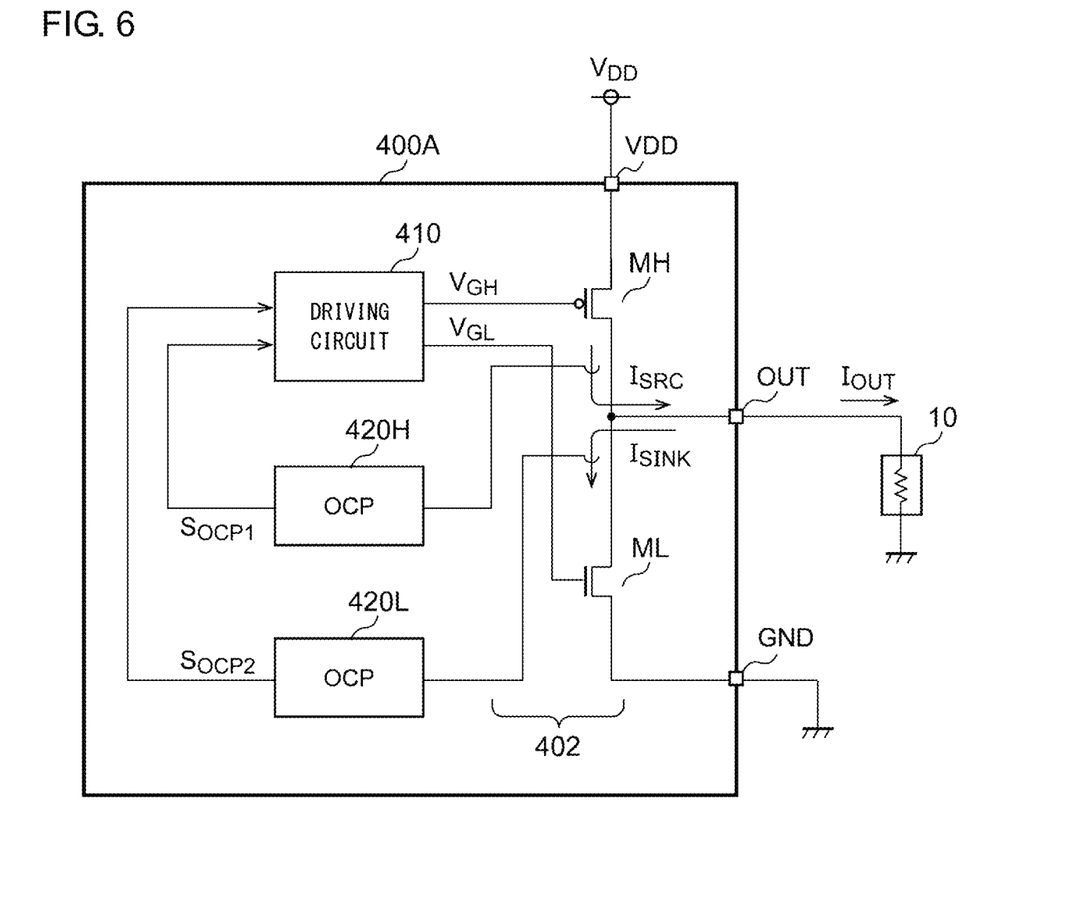
FIG. 6 is a circuit diagram showing a semiconductor integrated circuit according to a modification.

FIG. 6 is a circuit diagram showing a semiconductor integrated circuit 400A according to a modification. The semiconductor integrated circuit 400A includes a push-pull output stage 402 configured including a high-side transistor MH and a low-side transistor ML. The low-side transistor ML is configured as an N-channel MOSFET, and its drain is coupled to the OUT terminal, and its source is coupled to a ground (GND) terminal.

The driving circuit 410 adjusts gate voltages $V_{GH}$ and $V_{GL}$ to be applied to the high-side transistor MH and the low-side transistor ML, so as to control the electrical state of the load 10. A current that flows through the low-side transistor ML will be referred to as a "sink current $I_{SINK}$". The current $I_{OUT}$ that flows through the load 10 is represented by $I_{OUT} = I_{SRC} - I_{SINK}$.

The first OCP circuit 420H compares the source current $I_{SRC}$ with the threshold value $I_{OCP1}$, and generates the first OCP signal $S_{OCP1}$ that corresponds to the comparison result. Similarly, a second OCP circuit 420L compares a current detection signal $I_{SC2}$ that corresponds to the sink current $I_{SINK}$ that flows through the low-side transistor ML with a threshold value $I_{OCP2}$, and generates a second OCP signal $S_{OCP2}$ that corresponds to the comparison result. At least one from among the two threshold values $I_{OCP1}$ and $I_{OCP2}$, and preferably, both of them, are designed to have power supply voltage dependence. Also, the two threshold values $I_{OCP1}$ and $I_{OCP2}$ may each be designed to have a correlation between them. Also, the two threshold values $I_{OCP1}$ and $I_{OCP2}$ may be designed to be the same value.

Even if the OUT terminal is short-circuited to the power supply line (short circuit to power line state), this modification is capable of appropriately protecting the low-side transistor ML. Furthermore, if a voltage reduction state has occurred, this modification supports the overcurrent protection function.

Figure 7:
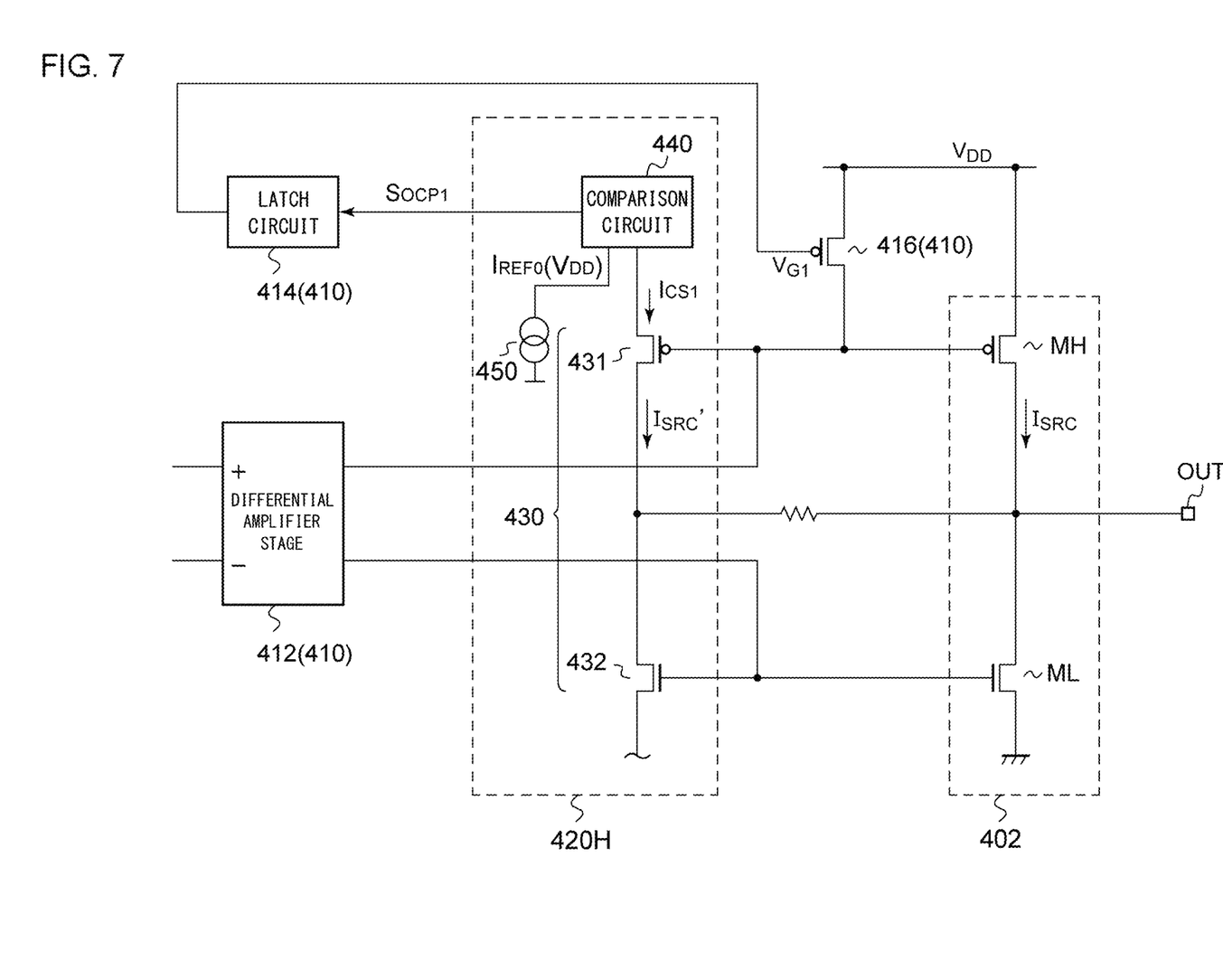
FIG. 7 is a circuit diagram showing an example configuration of a first OCP circuit.

Next, description will be made regarding an example configuration of the first OCP circuit 420H (second OCP circuit 420L). FIG. 7 is a circuit diagram showing an example configuration of the first OCP circuit 420H. The OCP circuit 420 includes a current detection circuit 430, a comparison circuit 440, and a threshold value adjustment circuit 450.

The current detection circuit 430 includes a replica circuit of the output stage 402. The replica circuit includes a replica transistor 431 of the high-side transistor MH and a replica transistor 432 of the low-side transistor ML. The gates of the replica transistors 431 and 432 are coupled to the gates of the transistors MH and ML, respectively, so as to form common gates. A detection current $I_{SRC}'$ flows through the replica transistor 431 in proportion to the source current $I_{SRC}$ that flows through the high-side transistor MH. The detection current $I_{SRC}'$ is supplied to the comparison circuit 440 as a current detection signal $I_{CS1}$. The threshold value adjustment circuit 450 generates a reference current $I_{REF0}(V_{DD})$ having power supply voltage dependence. The comparison circuit 440 is configured as a current comparator. The comparison circuit 440 compares the detection current $I_{SRC}'$ with the threshold value $I_{OCP1}$ that corresponds to the reference current $I_{REF0}$, and generates the first OCP signal $S_{OCP1}$ that corresponds to the comparison result.

The driving circuit 410 includes a differential amplifier stage 412, a latch circuit 414, and a protection transistor 416. The differential amplifier stage 412 controls the gate voltages $V_{GH}$ and $V_{GL}$ of the high-side transistor MH and the low-side transistor ML.

The protection transistor 416 is arranged between the gate and the source of the high-side transistor MH. In the normal state (non-overcurrent state), the protection transistor 416 is turned off. When the first OCP signal $S_{OCP1}$ is asserted, the latch circuit 414 latches the assertion, and outputs a low level to the gate of the protection transistor 416 so as to turn on the protection transistor 416. In this state, the gate-source line of the high-side transistor MH is short-circuited, which turns off the high-side transistor MH.

Figure 8:
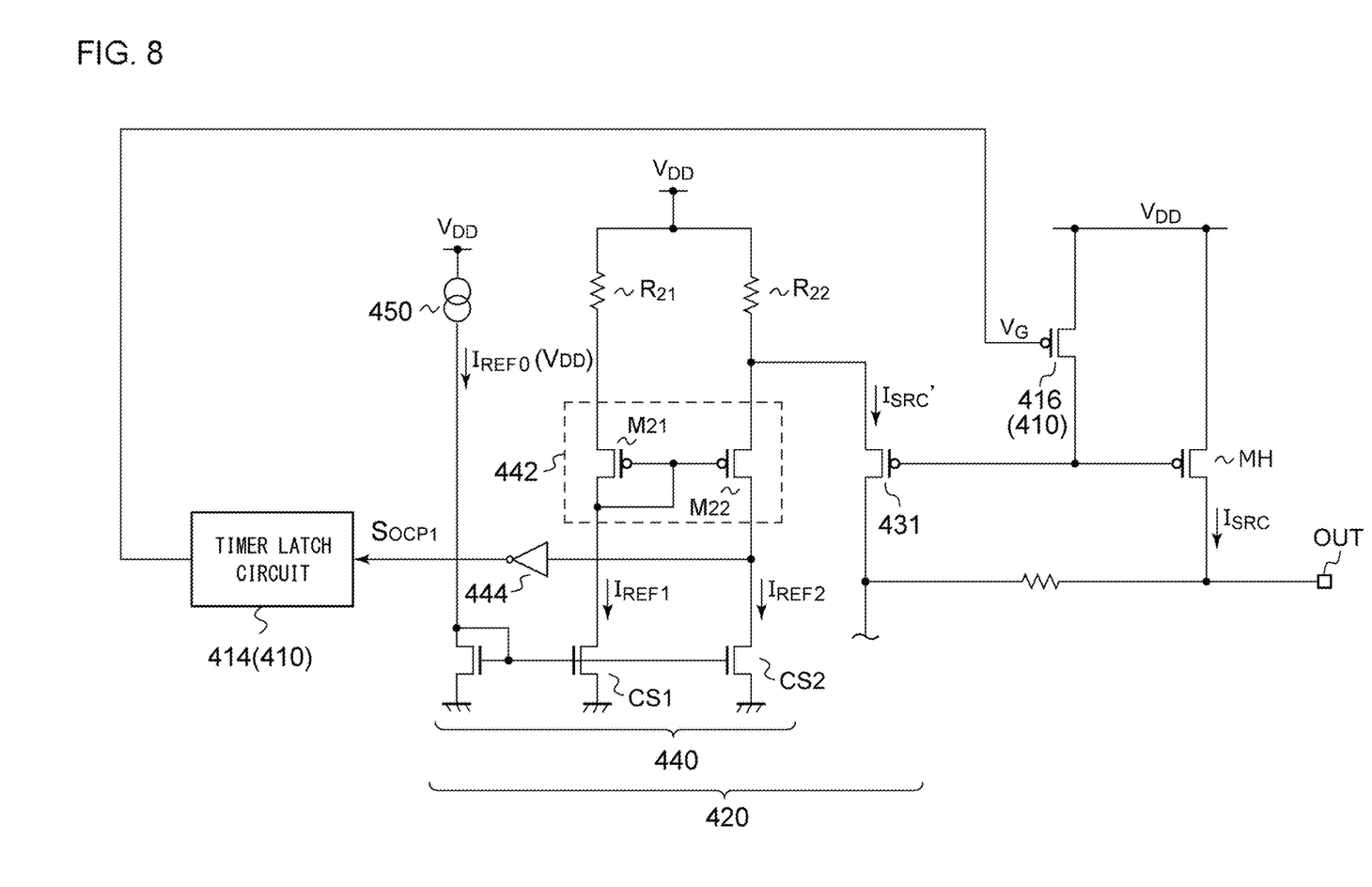
FIG. 8 is a diagram showing a more specific example configuration of the first OCP circuit.

FIG. 8 is a diagram showing a more specific example configuration of the first OCP circuit 420H. The latch circuit 414 may be a timer latch circuit configured to monitor the first OCP signal $S_{OCP1}$, and to output a low level when its assertion continues for a predetermined period of time.

The comparison circuit 440 includes a first resistor $R_{21}$, a second resistor $R_{22}$, a current mirror circuit 442, a first current source $CS_1$, and a second current source $CS_2$. The first resistor $R_{21}$ is arranged between the replica transistor 431 and the power supply line. The current mirror circuit 442 is configured such that the first resistor $R_{21}$ and the second resistor $R_{22}$ each function as a source load (or emitter load). The first current source $CS_1$ is coupled to a transistor $M_{21}$ arranged on the input side of the current mirror circuit 442. The second current source $CS_2$ is coupled to a transistor $M_{22}$ arranged on the output side of the current mirror circuit 442. The first OCP signal $S_{OCP1}$ is generated based on a voltage at a connection node (drain of the transistor $M_{22}$) that couples the current mirror circuit 442 and the second current source $CS_2$.

The gate voltage of the transistor $M_{21}$ ($M_{22}$) is determined according to the first resistor $R_{21}$, the transistor $M_{21}$, and the reference current $I_{REF1}$. Specifically, the gate voltage is represented by $V_{DD} - R_{21} \times I_{REF1} - V_{TH}$. Here, $V_{TH}$ represents the gate-source voltage of the transistor $M_{21}$.

When the current detection signal $I_{SRC}'$ is sufficiently small, the drain voltages of the transistors $M_{21}$ and $M_{22}$ are substantially the same, and are each maintained at a somewhat high level.

When the current detection signal $I_{SRC}'$ rises, this increases the voltage drop at the second resistor $R_{22}$. This reduces the source voltage of the transistor $M_{22}$, which lowers the gate-source voltage of the transistor $M_{22}$. In order to maintain the same reference current $I_{REF2}$, the drain-source voltage of the transistor $M_{22}$ is raised, which lowers the drain voltage of the transistor $M_{22}$. For example, the drain voltage of the transistor $M_{22}$ may be converted by an inverter 444 into a binary value, which may be employed as the first OCP signal $S_{OCP1}$. The current detection signal $I_{SRC}'$ value at which the level of the first OCP signal $S_{OCP1}$ changes corresponds to the threshold value $I_{OCP1}$. The threshold value $I_{OCP1}$ is determined based on the reference currents $I_{REF1}$ and $I_{REF2}$.

As described above, the threshold value adjustment circuit 450 generates the reference current $I_{REF0}$ having power supply voltage dependence. The method for generating the reference current $I_{REF}$ having power supply voltage dependence is not restricted in particular. Rather, various kinds of known circuits may be employed.

The reference current $I_{REF0}$ is used to provide the threshold value $I_{OCP1}$ for the comparison circuit 440 with power supply voltage dependence. The first current source $CS_1$ and the second current source $CS_2$ duplicate the reference current $I_{REF0}$ that corresponds to the reference current $I_{REF}$, so as to generate the reference currents $I_{REF1}$ and $I_{REF2}$. When the reference current $I_{REF0}$ falls due to a reduction of the power supply voltage $V_{DD}$, this reduces both the reference currents $I_{REF1}$ and $I_{REF2}$. With this arrangement, the threshold value $I_{OCP1}$ for the comparison circuit 440 is provided with power supply voltage dependence.

Next, description will be made regarding the usage of the semiconductor integrated circuit 400.

Figure 9:
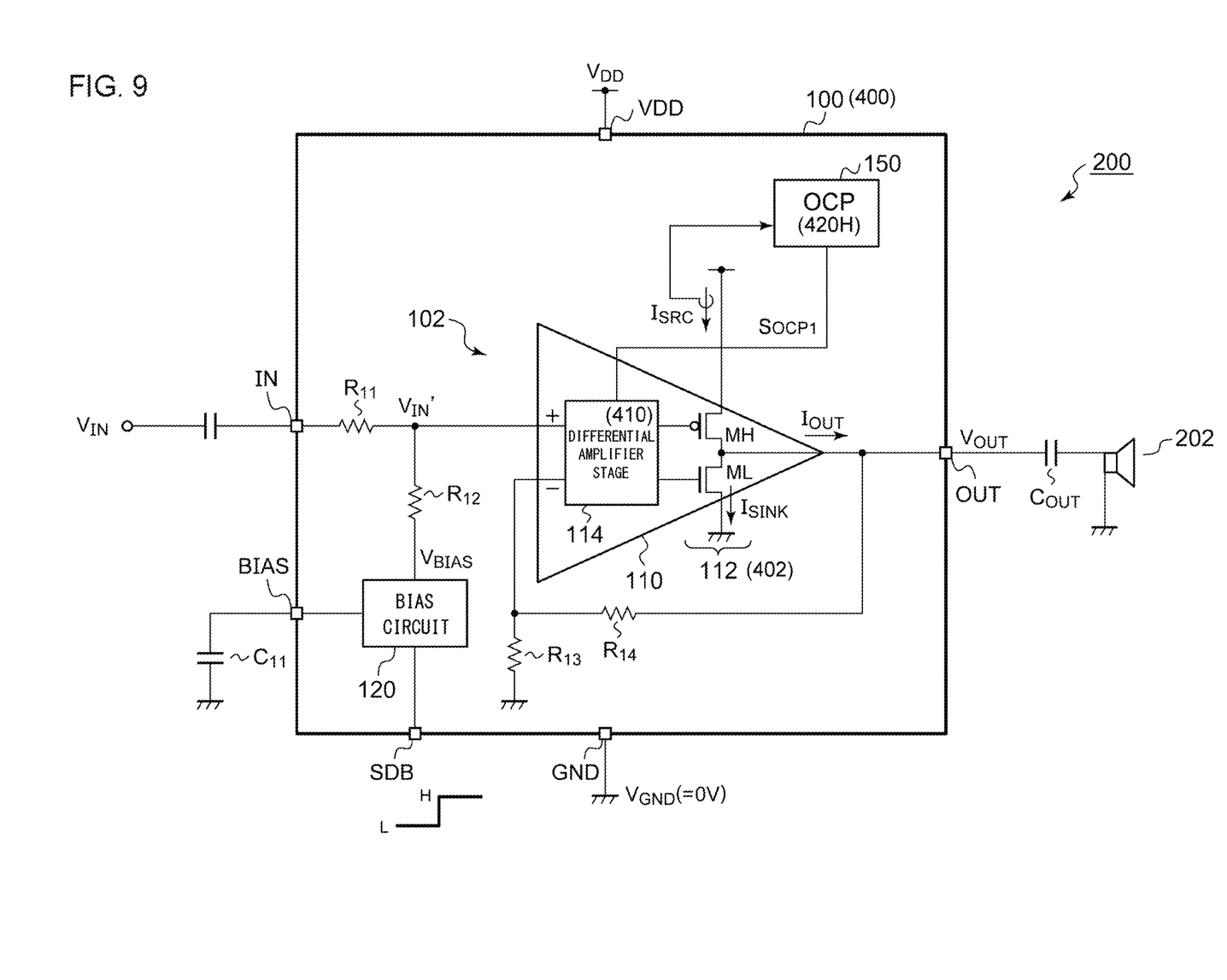
FIG. 9 is a block diagram showing an audio output apparatus including an audio amplifier according to an embodiment.

FIG. 9 is a block diagram showing an audio output apparatus 200 including an audio amplifier 100 according to an embodiment. The audio output apparatus 200 includes an electroacoustic conversion element 202 and the audio amplifier 100.

The audio amplifier 100 corresponds to the above-described semiconductor integrated circuit 400. The audio amplifier 100 mainly includes an operational amplifier 110, a bias circuit 120, and a first OCP circuit 150. The audio amplifier 100 is configured as a function IC (Integrated Circuit) integrated on a single semiconductor substrate (die).

The operational amplifier 110 forms an amplifier 102 together with multiple resistors $R_{11}$ through $R_{14}$. FIG. 9 shows an arrangement in which the amplifier 102 is configured as a non-inverting amplifier. However, the present invention is not restricted to such an arrangement. Also, the amplifier 102 may be configured as an inverting amplifier.

The audio amplifier 100 includes a shutdown (SDB) pin via which a shutdown (SDB) signal is to be input. When the SDB signal is set to a first level (e.g., low level), the audio amplifier 100 is set to a shutdown state. When the shutdown signal is set to a second level (e.g., high level), the shutdown state is canceled.

The bias circuit 120 generates a bias voltage $V_{BIAS}$ for the amplifier 102. A capacitor $C_{11}$ is coupled as an external component to the bias circuit 120 via a bias (BIAS) pin. The bias circuit 120 starts to generate the bias voltage $V_{BIAS}$ in response to the cancelation of the shutdown state. The bias voltage $V_{BIAS}$ is gradually raised according to the time constant determined by the capacitor $C_{11}$. The bias voltage $V_{BIAS}$ is supplied to the amplifier 102.

The operational amplifier 110 includes an output stage 112 and a differential amplifier stage 114. The output stage 112 is configured as a push-pull output stage including a high-side transistor MH and a low-side transistor ML, which corresponds to the output stage 402 shown in FIG. 6. Furthermore, the differential amplifier stage 114 corresponds to the driving circuit 410 shown in FIG. 6. The differential amplifier stage 114 controls the output stage 112 such that the voltage at the non-inverting terminal (+) approaches the voltage at the inverting input terminal (−).

The first OCP circuit 150 corresponds to the OCP circuit 420H shown in FIG. 6. The first OCP circuit 150 compares the source current $I_{SRC}$ that flows through the high-side transistor MH of the output stage 112 with the overcurrent threshold value $I_{OCP}$. When the source current $I_{SRC}$ exceeds the overcurrent threshold value $I_{OCP}$, the first OCP circuit 150 asserts the OCP signal $S_{OCP1}$. The differential amplifier stage 114 turns off the high-side transistor MH in response to the assertion of the OCP signal $S_{OCP1}$. The audio amplifier 100 may further include a second OCP circuit 420L that detects an overcurrent state that can occur in the low-side transistor ML.

Description has been made above regarding the present invention with reference to the embodiments. The above-described embodiments have been described for exemplary purposes only, and are by no means intended to be interpreted restrictively. Rather, it can be readily conceived by those skilled in this art that various modifications may be made by making various combinations of the above-described components or processes, which are also encompassed in the technical scope of the present invention. Description will be made below regarding such modifications.

Modification 1

Figure 10:
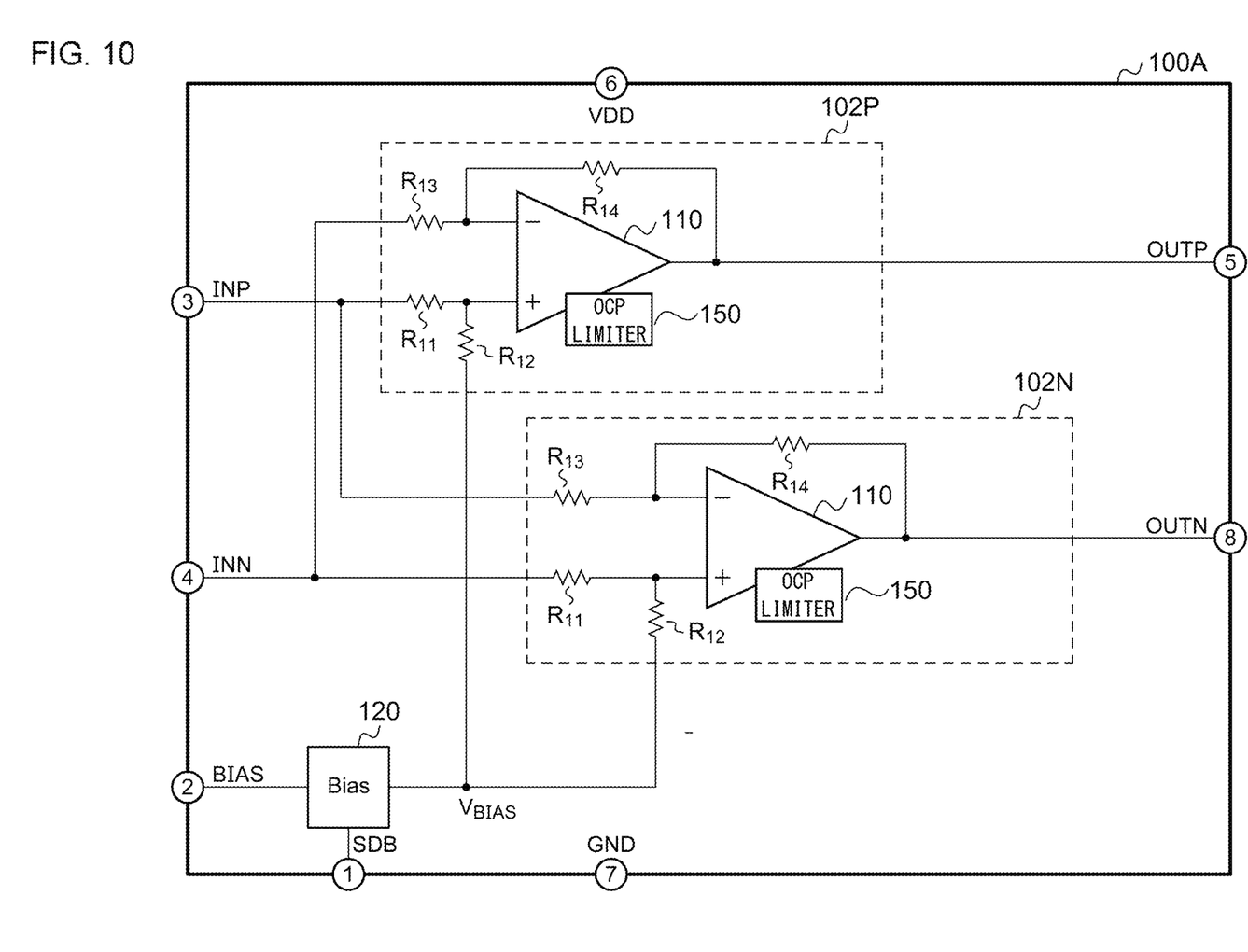
FIG. 10 is a block diagram showing a BTL audio amplifier.

Description has been made in the embodiment regarding an arrangement in which the audio amplifier 100 is configured as a single-ended amplifier. Also, the present invention is applicable to a BTL audio amplifier. FIG. 10 is a block diagram showing a BTL audio amplifier 100A. The audio amplifier 100A includes amplifiers 102P and 102N. The amplifiers 102P and 102N each have the same configuration as that of the above-described amplifier 102 except that the resistors $R_{13}$ thereof are coupled to the input of the other amplifier instead of each resistor $R_{13}$ being grounded.

Modification 2

Description has been made in the embodiment regarding the audio amplifier configured including MOS transistors. Also, a part of the transistors may be configured as bipolar transistors. In this case, the gate, source, and drain correspond to the base, emitter, and collector, respectively.

Modification 3

Description has been made in the embodiment regarding an arrangement in which the threshold value currents $I_{OCP1}$ and $I_{OCP2}$ each have no temperature dependence. However, the present invention is not restricted to such an arrangement. The high-side transistor MH and the low-side transistor ML each has an on resistance having temperature dependence with a positive temperature coefficient. That is to say, when the temperature becomes high, the load lines (ii) and (iii) shift downward. Accordingly, the threshold currents $I_{OCP1}$ and $I_{OCP2}$ may each be designed to have negative temperature characteristics. In a case in which the temperature becomes high, the current that flows due to the occurrence of the short-circuit state becomes small. In this case, by lowering the threshold values $I_{OCP1}$ and $I_{OCP2}$, such an arrangement supports robust protection.

Modification 4

In the first OCP circuit 420H, the method for comparing the detection signal $I_{CS1}$ that corresponds to the current $I_{SRC}$ with the threshold value $I_{OCP1}$ is not restricted in particular. For example, an arrangement may be made in which the current $I_{SRC}$ is converted into a voltage detection signal, and the voltage detection signal thus converted is compared with a threshold voltage $V_{OCP1}$ that corresponds to the threshold value $I_{OCP1}$. Also, the threshold voltage $V_{OCP1}$ may be designed to have power supply voltage dependence. The same can be said of the second OCP circuit 420L.

Modification 5

Description has been made regarding the audio amplifier 100 as an example of the usage of the present invention. However, the present invention is not restricted to such an arrangement. Also, the present invention is widely applicable to various kinds of circuits including a power transistor in its output stage to be designed to have a latch stop function, examples of which include power supply circuits, motor drivers, etc.

Usage

Figure 11A:
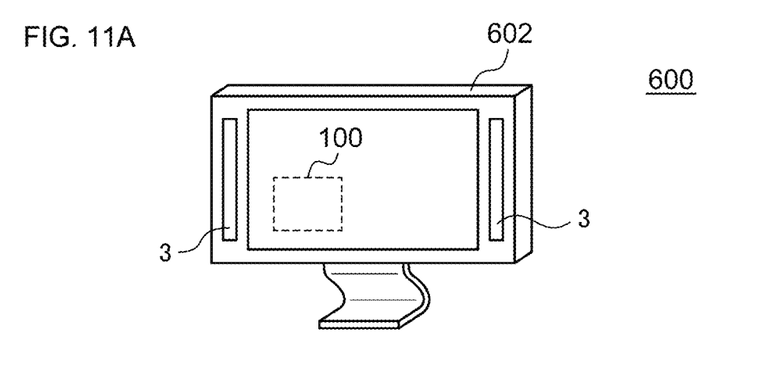
FIG. 11A through FIG. 11C are external views each showing an electronic device.
Figure 11B:
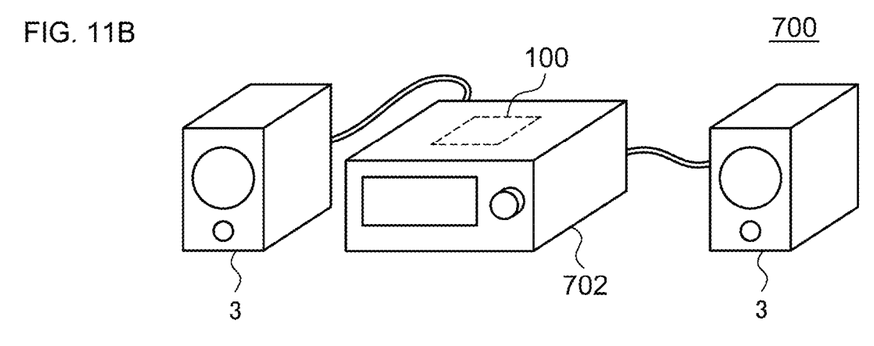
Figure 11C:
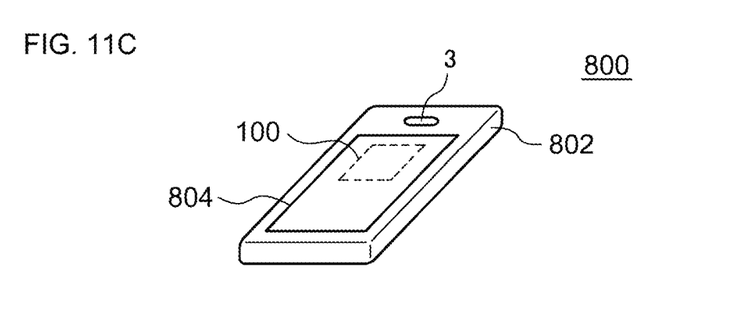

Lastly, description will be made regarding an application of the audio output apparatus 200. FIG. 11A through FIG. 11C are external views each showing an electronic device 1. FIG. 11A shows a display apparatus 600 which is an example of the electronic device 1. The display apparatus 600 includes a housing 602 and a speaker 3. The audio output apparatus 200 is built into the housing, and is configured to drive the speaker 3. The speaker 3 corresponds to the electroacoustic conversion element 202.

FIG. 11B shows an audio component device 700 which is an example of the electronic device 1. The audio component device 700 includes a housing 702 and the speaker 3. The audio output apparatus 200 is built into the housing 702, and is configured to drive the speaker 3.

FIG. 11C shows a compact information terminal 800 which is an example of the electronic device 1. The compact information terminal 800 is configured as a smartphone, tablet terminal, audio player, digital still camera, digital video camera, and the like. The compact information terminal 800 includes a housing 802, the speaker 3, and a display 804. The audio output apparatus 200 is built into the housing 802, and is configured to drive the speaker 3.

While the preferred embodiments of the present invention have been described using specific terms, such description is for illustrative purposes only, and it is to be understood that changes and variations may be made without departing from the spirit or scope of the appended claims.

What is claimed is:

1. A semiconductor integrated circuit comprising:
   an output terminal to be coupled to a load;
   a high-side transistor structured as a PMOS transistor having a source coupled to a power supply line and a drain coupled to the output terminal;
   a first overcurrent protection circuit structured to compare a first current detection signal that corresponds to a current that flows through the high-side transistor with a first threshold value having a positive correlation with a power supply voltage of the power supply line, and to generate a first overcurrent protection signal that indicates a comparison result; and
   a driving circuit structured to turn off the high-side transistor according the first overcurrent protection signal such that the first threshold value becomes higher when the power supply voltage becomes higher.

2. The semiconductor integrated circuit according to claim 1, wherein the first threshold value is linearly changed according to the power supply voltage.

3. The semiconductor integrated circuit according to claim 2, wherein a slope of the first threshold value with respect to the power supply voltage is equal to or greater than a slope of an upper limit line of an operation-guaranteed range.

4. The semiconductor integrated circuit according to claim 2, wherein a slope of the first threshold value with respect to the power supply voltage is equal to or smaller than a slope of a load line when the output terminal is short-circuited to a ground.

5. The semiconductor integrated circuit according to claim 1, wherein the first threshold value has a negative temperature coefficient.

6. The semiconductor integrated circuit according to claim 1, wherein the first overcurrent protection circuit comprises:
   a replica transistor having a gate coupled to a gate of the high-side transistor so as to form a common gate; and
   a comparison circuit structured to compare the first current detection signal generated based on a current that flows through the replica transistor with the first threshold value.

7. The semiconductor integrated circuit according to claim 6, wherein the comparison circuit comprises:
- a first resistor;
- a second resistor arranged between the replica transistor and the power supply line;
- a current mirror circuit arranged with the first resistor and the second resistor as emitter/source loads;
- a first current source coupled to an input of the current mirror circuit; and
- a second current source coupled to an output of the current mirror circuit,
- wherein the first overcurrent protection signal corresponds to a state of a connection node that couples the current mirror circuit and the second current source,
- and wherein reference currents generated by the first current source and the second current source each have power supply voltage dependence.

8. The semiconductor integrated circuit according to claim 1, further comprising:
- a low-side transistor structured as an NMOS transistor having a drain coupled to the output terminal and a source coupled to a ground line; and
- a second overcurrent protection circuit structured to compare a second current detection signal that corresponds to a current that flows through the low-side transistor with a second threshold value having a positive correlation with the power supply voltage, and to generate a second overcurrent protection signal that indicates a comparison result,
- wherein the driving circuit is structured to latch-stop a driving operation of the low-side transistor according to the second overcurrent protection signal.

9. The semiconductor integrated circuit according to claim 8, wherein the second threshold value is linearly changed according to the power supply voltage.

10. The semiconductor integrated circuit according to claim 8, wherein the second threshold value is changed together with the first threshold value.

11. The semiconductor integrated circuit according to claim 8, wherein the high-side transistor and the low-side transistor are structured as a push-pull output stage of an operational amplifier.

12. The semiconductor integrated circuit according to claim 11, wherein the operational amplifier is structured to amplify an audio signal,
- and wherein an electroacoustic conversion element is coupled to the output terminal.

13. An audio output apparatus comprising:
- an electroacoustic conversion element; and
- the semiconductor integrated circuit according to claim 12, structured to drive the electroacoustic conversion element.

14. An electronic device comprising the audio output apparatus according to claim 13.

15. A protection method for an audio amplifier, wherein the audio amplifier comprises a push-pull output stage comprising a high-side transistor and a low-side transistor, and wherein the protection method comprises:
- latch-stopping the audio amplifier when a source current that flows through the high-side transistor exceeds a first threshold value; and
- adjusting the first threshold value such that it has a positive correlation with respect to a power supply voltage to be supplied to the audio amplifier and the first threshold value becomes higher when the power supply voltage becomes higher.

* * * * *